(12) United States Patent
Nagamine et al.

(10) Patent No.: US 6,267,516 B1
(45) Date of Patent: Jul. 31, 2001

(54) DEVELOPING APPARATUS AND DEVELOPING NOZZLE

(75) Inventors: Shuichi Nagamine, Kikuchi-gun; Masami Akimoto; Akira Nishiya, both of Kumamoto; Hitoshi Kosugi, Kikuchi-gun, all of (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/583,384

(22) Filed: May 30, 2000

(30) Foreign Application Priority Data

May 31, 1999 (JP) ................................... 11-151362

(51) Int. Cl.[7] ................................................... G03D 5/00
(52) U.S. Cl. ............................. 396/604; 396/611; 118/52
(58) Field of Search ..................... 396/604, 611, 396/627; 118/52, 316, 319, 320, 500, 419, 712, 716, 666–668; 134/902, 24, 34, 3, 4

(56) References Cited

U.S. PATENT DOCUMENTS

| | | | |
|---|---|---|---|
| 5,221,345 | * 6/1993 | Blankenship et al. | 118/63 |
| 5,664,254 | 9/1997 | Ohkura et al. | 396/612 |
| 5,700,127 | 12/1997 | Harada et al. | 414/416 |
| 5,854,953 | * 12/1998 | Semba | 396/611 |
| 5,866,307 | 8/2000 | Kiba et al. | 430/327 |

* cited by examiner

Primary Examiner—D. Rutledge
(74) Attorney, Agent, or Firm—Fulbright & Jaworski L.L.P.

(57) ABSTRACT

A developing apparatus comprises a table on which is disposed a substrate having a resist coating film formed thereon, a nozzle for supplying a developing solution to the substrate disposed on the table, a liquid supplying mechanism for supplying the developing solution to the nozzle, and a moving mechanism for relatively moving the nozzle and the substrate, wherein the nozzle includes a liquid inlet port communicating with the liquid supplying mechanism, a liquid reservoir for temporarily storing the developing solution supplied from the liquid supplying mechanism through the liquid inlet port, a narrow passageway communicating with the bottom portion of the liquid reservoir to cause pressure loss of the developing solution coming from the liquid reservoir, a linear liquid discharge section having a discharge port passageway communicating with the narrow passageway, and a buffering member arranged within the discharge port passageway and in the vicinity of the outlet port of the narrow passageway, the buffering member weakening the strength of the developing solution coming out of the narrow passageway so as to weaken the impact given by the developing solution discharged from the discharge port to the resist coating film.

20 Claims, 10 Drawing Sheets

DEVELOPING APPARATUS AND
DEVELOPING NOZZLE

CROSS-REFERENCE TO RELATED
APPLICATIONS

This application is based upon and claims the benefit of priority from the prior Japanese Patent Application No. 11-151362, filed May 31, 1999, the entire contents of which are incorporated herein by reference.

BACKGROUND OF THE INVENTION

The present invention relates to a developing apparatus and a developing nozzle used in the manufacture of a semiconductor device or a liquid crystal display (LCD) device, particularly, to a developing apparatus and a developing nozzle for development of a chemically amplified resist film in photolithography of a semiconductor device.

In a manufacturing process of a semiconductor device, a semiconductor wafer is coated with resist, and the coated resist film is baked, exposed to light and, then, developed. Used in such treatments are a coating-developing system disclosed in, for example, U.S. Pat. No. 5,664,254 and U.S. Pat. No. 5,700,127. The coating-developing system, which is used in combination with a light exposure apparatus in a photolithography for a semiconductor device, includes a resist coating unit and a developing unit.

In the developing unit, a wafer having a resist film formed thereon, said resist film bearing a light-exposed latent image, is held by a spin chuck, and a nozzle extending over the diameter of the wafer is positioned right above the wafer. Under this condition, the wafer is rotated to make at least half the complete rotation while supplying a developing solution from the discharge port of the nozzle onto the wafer. As a result, a film of the developing solution is formed in a uniform thickness over the entire upper surface of the wafer. The wafer having the film of the developing solution formed thereon is held stationary for a predetermined time to have the developing solution kept in contact with the resist film formed on the wafer so as to develop the light-exposed latent image formed in the resist film. The particular developing method is called a puddle development.

In the puddle development, it is desirable to make the total residence time (total contact time) of the developing solution uniform over the entire surface of the wafer in order to ensure uniformity of the line width of the circuit. Therefore, it is necessary to coat the entire surface of the wafer with the developing solution as promptly as possible and, thus, the developing solution is supplied from the supply source to the nozzle at a high pressure.

However, since the discharge port of the nozzle has a small diameter, a high supply pressure of the developing solution imparts an excessively large impact to the light-exposed latent image formed in the resist film, leading to nonuniformity in the line width. Particularly, since the line width of the pattern formed in a chemically amplified resist film is on the submicron order, a serious influence tends to be imparted to the light-exposed latent image formed in the resist film, if the developing solution discharged from the nozzle has a large colliding force.

It should also be noted that the developing nozzle is made of a resin having a high water repellency. Therefore, if the developing solution is discharged at a high speed, the discharge range of the developing solution tends to be narrowed when the developing solution is discharged from the discharge port, with the result that the developing solution tends to fail to be supplied to the entire region of the wafer so as to bring about undeveloped portions. The tendency is particularly prominent in the case of the scanning system in which the developing solution is discharged while the nozzle is moved along the wafer surface.

BRIEF SUMMARY OF THE INVENTION

An object of the present invention is to provide a developing apparatus that permits improving the uniformity of the line width and also permits preventing nonuniformity of resolution (nonuniform development).

Another object of the present invention is to provide a developing nozzle that permits suppressing the colliding force of the developing solution against the resist film and also permits uniformly supplying the developing solution over the entire region of the substrate.

According to a first aspect of the present invention, there is provided a developing apparatus, comprising a table on which is disposed a substrate having a resist coating film formed thereon, a nozzle for supplying a developing solution to the substrate disposed on the table, a liquid supplying mechanism for supplying the developing solution to the nozzle, and a moving mechanism for relatively moving the nozzle and the substrate, wherein the nozzle includes a liquid inlet port communicating with the liquid supplying mechanism, a liquid reservoir for temporarily storing the developing solution supplied from the liquid supplying mechanism through the liquid inlet port, a narrow passageway communicating with the bottom portion of the liquid reservoir to cause pressure loss of the developing solution coming from the liquid reservoir, a linear liquid discharge section having a discharge port passageway communicating with the narrow passageway, and a buffering member arranged within the discharge port passageway and in the vicinity of the outlet port of the narrow passageway, the buffering member weakening the strength of the developing solution coming out of the narrow passageway so as to weaken the impact given by the developing solution discharged from the discharge port to the resist coating film.

The buffering member is housed within the discharge port passageway so as to prevent the buffering member from coming out of the liquid discharge section. Also, it is desirable for the buffering member to be positioned above the lowermost portion of the liquid discharge section.

The buffering member, which consists of a single rod, extends from at least one end portion to the other end portion of the discharge port passageway. In this case, the both end portions of the rod-like buffering member are supported by the liquid discharge section. It is possible for the rod-like buffering member to have a circular cross section, an elliptical cross section or a gourd-shaped cross section. It is also possible for the rod-like buffering member to be externally threaded.

It is possible for the buffering member to consist of a plurality of granular bodies or lumps that are linearly arranged to extend from one end portion to the other end portion of the discharge port passageway. In this case, it is desirable for the plural granular bodies or lumps to be supported by the lower portion of the liquid discharge section.

It is possible for the narrow passageway to be open in the center at the bottom of the liquid reservoir and to consist of a large number of fine holes each having a diameter smaller than the clearance of the discharge port passageway. It is also possible for the narrow passageway to consist of a slit open in the center at the bottom of the liquid reservoir and having a width smaller than the width of the discharge port passageway.

The linear liquid discharge section is longer than at least the radius of the substrate. The nozzle of this type permits easily forming a layer of a developing solution on the substrate so as to facilitate formation of the puddle phenomenon.

According to a second aspect of the present invention, there is provided a developing nozzle used in a photolithography process, comprising a liquid inlet port for receiving a developing solution, a liquid reservoir for temporarily storing the developing solution received through the liquid inlet port, a narrow passageway communicating with the bottom portion of the liquid reservoir and serving to lower the pressure of the developing solution coming from the liquid reservoir, a linear liquid discharge section having a discharge port passageway communicating with the narrow passageway, and a buffering member arranged within the discharge port passageway and positioned in the vicinity of the outlet port of the narrow passageway, the buffering member serving to weaken the strength of the developing solution coming out of the narrow passageway so as to weaken the impact given by the developing solution discharged from the discharge port to the resist coating film.

The buffering member is arranged right under the opening of the narrow passageway and is positioned somewhat higher than the lowermost end of the liquid discharge section. Since the buffering member is held within the liquid discharge section, the developing solution is held within the liquid discharge section so as to prevent the developing solution from dropping from the discharge port of the nozzle during non-operation of the nozzle. Also, since the buffering member is not exposed to the outside through the discharge port, foreign matters are not attached to the buffering member. It follows that the buffering member is kept clean.

The buffering member is made of a hydrophilic material such as quartz so as to further improve the liquid holding function of the buffering member and the discharge port. Also, the hydrophilic buffering member facilitates the flow of the developing solution from the narrow passageway to the discharge port, with the result that the developing solution can be supplied smoothly to the discharge port.

Since the developing solution is alkaline, the buffering member is made of a material exhibiting a resistance to alkali and hydrophilic properties. The materials meeting these requirements include, for example, quartz, alumina, silicon nitride, silicon, a silicon-based ceramic material and a silicone resin. It is most desirable to use quarts for forming the buffering member. Since quarts exhibits excellent hydrophilic properties, the developing solution can be guided promptly from the header to the liquid discharge port via the buffering member made of quartz. Also, since the buffering member made of quarts firmly holds the developing solution, the developing solution is prevented without fail from being dropped from the discharge port during non-operation of the nozzle. Incidentally, the buffering member made of silicon or a silicone resin, even if dissolved in the developing solution, does not give a detrimental effect to the developing solution. In other words, the developing solution is not contaminated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Various preferred embodiments of the present invention will now be described with reference to the accompanying drawings.

Figure 1:
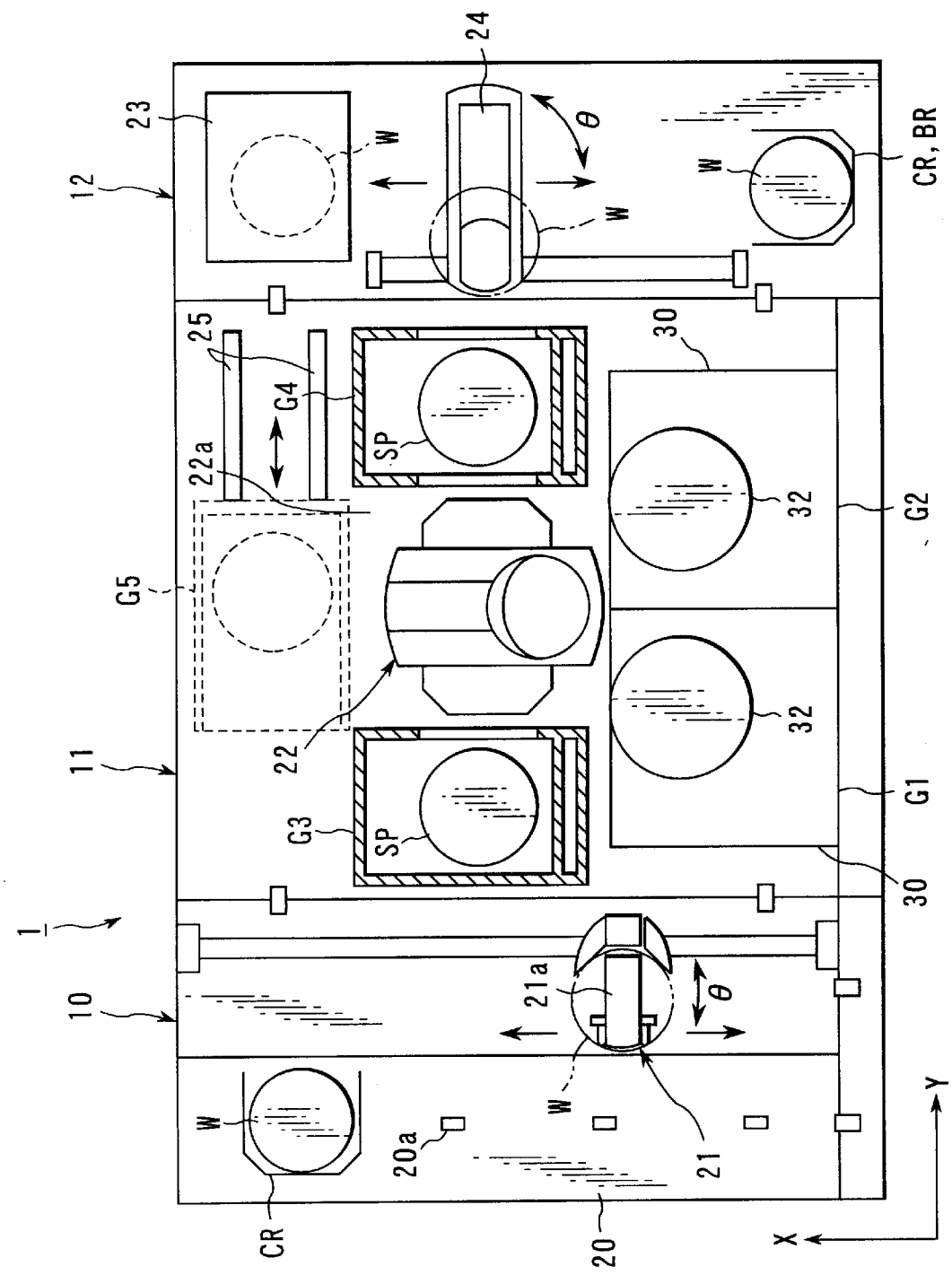
FIG. 1 is a perspective plan view showing a coating-developing system.
Figure 2:
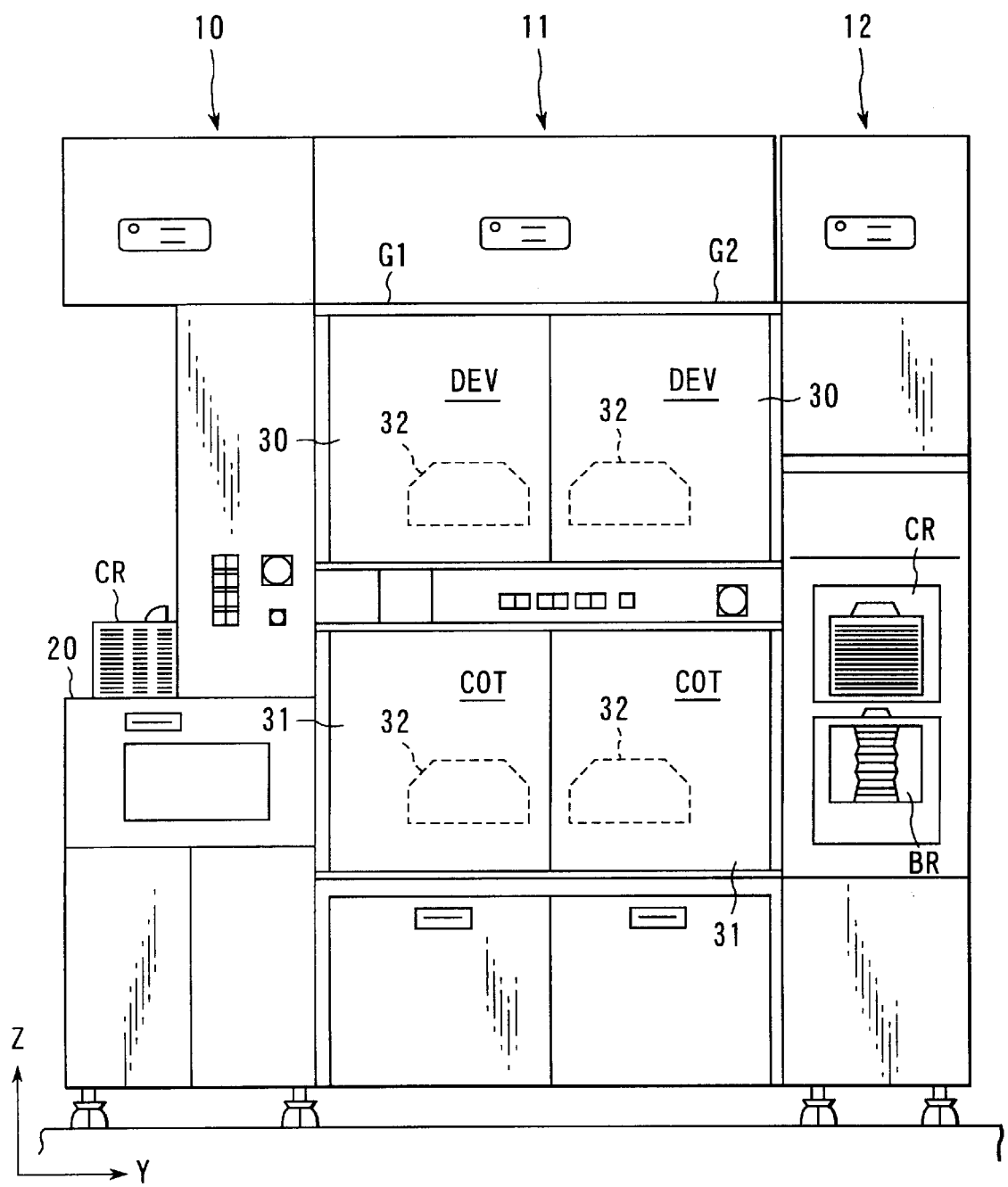
FIG. 2 is a plan view schematically showing a coating-developing system.
Figure 3:
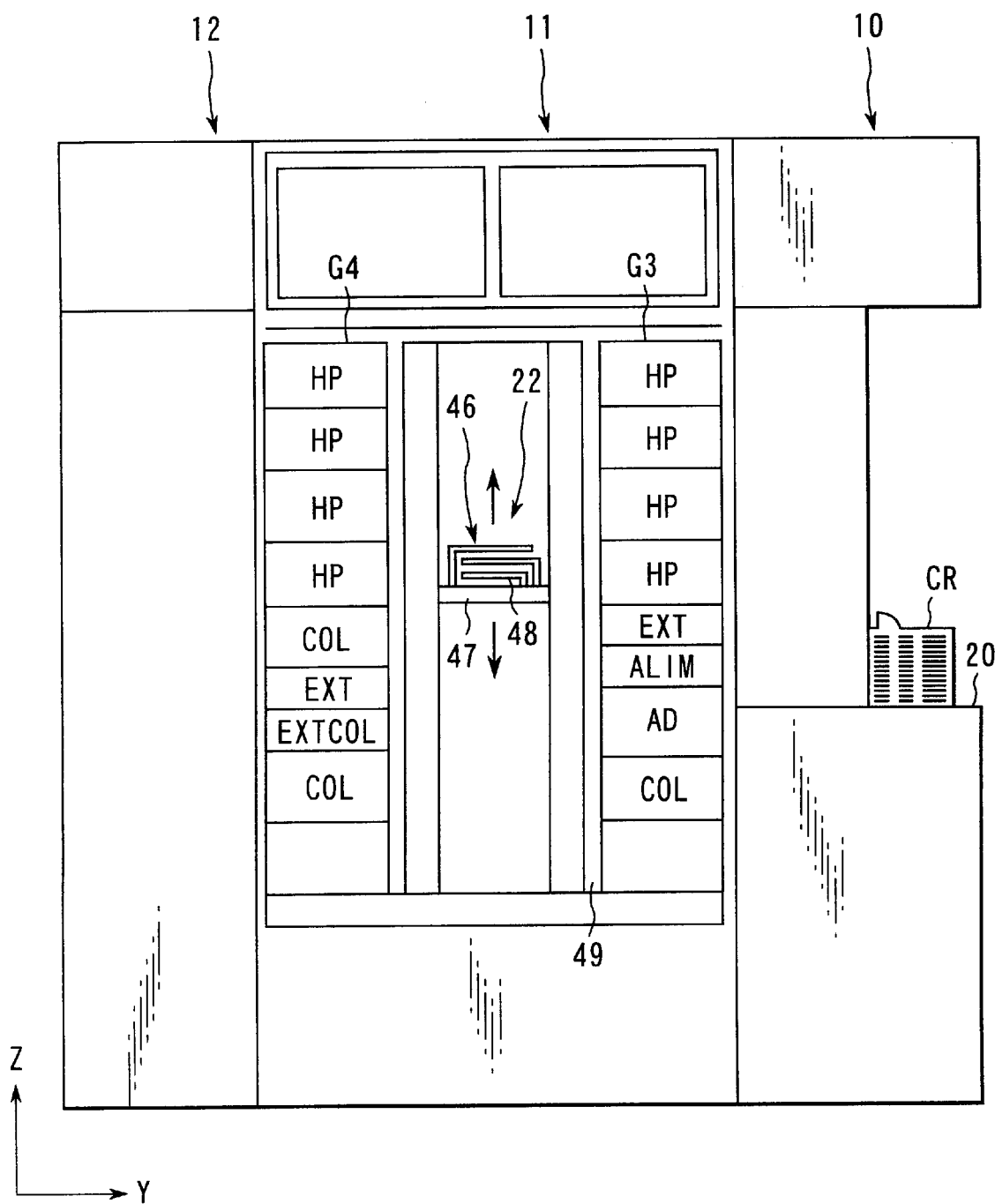
FIG. 3 is a back view schematically showing a coating-developing system.

As shown in FIGS. 1 to 3, a coating-developing system 1 comprises a cassette section 10, a process section 11 and an interface section 12. The system 1 is connected to a light exposure apparatus (not shown) via the interface section 12.

The cassette section 10 includes a table 20, a first sub-arm mechanism 21 and a transfer path. A cassette CR is loaded on or unloaded from the cassette table 20 by a transfer robot (not shown) or by an operator (not shown). A plurality of semiconductor wafers W, e.g., 25 wafers W, are housed in the cassette CR loaded on the table 20. Four projections 20a are mounted on the table 20 such that the position of the cassette CR relative to the system 1 is determined by each of the projections 20a.

The transfer path extends in a direction of the X-axis along the table 20, and the first sub-arm mechanism 21 is mounted within the X-axis transfer path. The first sub-arm mechanism 21 includes a wafer holder 211a for holding the wafer W and driving mechanisms (not shown) including a back-and-forth driving mechanism, an X-axis driving mechanism, a Z-axis driving mechanism, and a θ-swing driving mechanism. The back-and-forth driving mechanism moves the wafer holder 21a back and forth. The X-axis driving mechanism moves the wafer holder 21a in the X-axis direction. The Z-axis driving mechanism moves the wafer holder 21a in the Z-axis direction. Further, the θ-swing driving mechanism swings the wafer holder 21a about the Z-axis. On the other hand, the first sub-arm mechanism 21 takes the wafer W out of the cassette CR or puts the wafer W in the cassette CR. Also, the first sub-arm mechanism 21 gains access to an alignment unit (ALIM) and an extension unit (EXT) of the process section 11.

The process section 11 includes a plurality of process unit groups G1 to G4(G5), a main arm mechanism 22 and a vertical transfer path 22a. The main arm mechanism 22 is positioned substantially in the center of the process section 11, and the process unit groups G1 to G4(G5) are arranged to surround the main arm mechanism 22.

As shown in FIG. 3, the main arm mechanism 22 includes a transfer section 46, a cylindrical support member 49 and driving mechanisms (not shown) such as a back-and-forth driving mechanism, a Z-axis driving mechanism and a θ-swing driving mechanism. The cylindrical support member 49 extends in the direction of Z-axis. The Z-axis driving mechanism moves the transfer section 46 in the Z-direction within the cylindrical support member 49. Further, the θ-swing driving mechanism swings the transfer section 46 about the Z-axis within the cylindrical support member 49. The transfer section 46 includes a plurality of wafer holders 48 and the back-and-forth driving mechanism serving to independently move each of the wafer holders 48 back and forth.

As shown in FIGS. 1 and 2, the first and second process unit groups G1 and G2 are arranged side by side on the front side of the system 1. As shown in FIGS. 1 and 3, the third process unit group G3 is arranged adjacent to the cassette section 10, and the fourth process unit group G4 is arranged adjacent to the interface section 12. Incidentally, it is possible to arrange the fifth process unit group G5 on the back side of the system 1.

The first process unit group G1 includes two spinner type process units (COT)/(DEV). These spinner type process units (COT)/(DEV) are stacked one upon the other and are provided with cups 32 for the liquid processing. In the embodiment shown in the drawing, the developing unit 30 is stacked on the resist coating unit 31. The second process unit group G2 is substantially equal in construction to the first process unit group G1.

As shown in FIG. 3, the third process unit group G3 includes 8 oven-type process units consisting of a cleaning unit (COL), an adhesion unit (AD), an alignment unit (ALIM), and an extension unit (EXT), and four hot plate units (HP), which are stacked in the order mentioned such that the cleaning unit (COL) is arranged in the lowermost position. It is possible to use a cleaning unit (COL) in place of the alignment unit (ALIM) to allow the cleaning unit (COL) to perform the function of positioning the wafer as desired.

The fourth process unit group G4 also includes 8 oven-type process units consisting of a cleaning unit (COL), an extension-cleaning unit (EXTCOL), an extension unit (EXT), a cleaning unit (COL), and four hot plate units (HP), which are stacked one upon the other in the order mentioned such that the cleaning unit (COL) referred to first is arranged in the lowermost position.

It is possible to arrange the fifth process unit group G5 on the back side of the main arm mechanism 22. The fifth process unit group G5 is movable in the Y-axis direction along a guide rail 25, making it possible to apply maintenance to the main arm mechanism 22 from behind the main arm mechanism 22. The fifth process unit group G5 is substantially equal in construction to the third and fourth process unit groups G3, G4.

The interface section 12 includes a pick-up cassette CR that can be transferred, a buffer cassette BR, which is held stationary, a peripheral light-exposure device 23, and a second sub-arm mechanism 24. The second sub-arm mechanism 24 is substantially equal in construction to the first sub-arm mechanism 21. The second sub-arm mechanism 24 is capable of gaining access to the extension unit (EXT) of the process section 11 and to a wafer delivery table (not shown) of the light exposure device.

Figure 4:
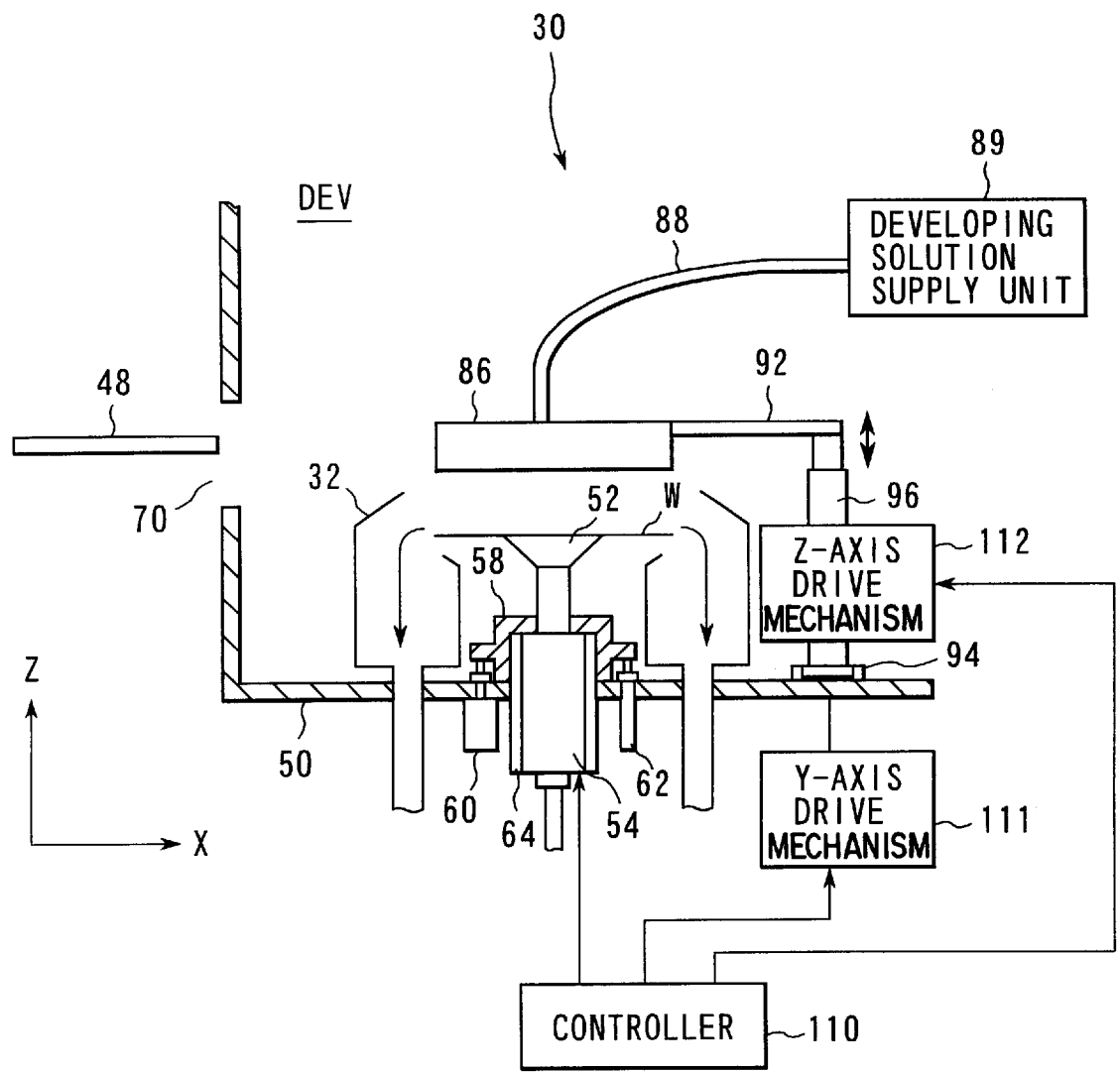
FIG. 4 is a block diagram showing a developing apparatus according to one embodiment of the present invention.

The developing unit 30 (DEV) will now be described with reference to FIGS. 4 and 5.

A wafer delivery port 70 is formed on one side wall of the developing unit 30. The wafer delivery port 70 can be opened or closed by a shutter (not shown). If the shutter is opened, the wafer W held by the wafer holder 48 of the main arm mechanism 22 is put into or taken out of the developing unit 30 through the wafer delivery port 70.

The cup 32 is arranged in substantially the center of the developing unit 30, and a spin chuck 52 is arranged inside the cup 32. The spin chuck 52 is provided with a rotary driving mechanism (not shown), a vertical driving mechanism (not shown) and a vacuum suction mechanism (not shown). A motor 54 of the rotary driving mechanism is controlled by a controller 110 so as to permit rotation of the spin chuck 52. A cylinder 60 of the vertical driving mechanism is controlled by the controller 110 so as to permit the spin chuck 52 to be moved in a vertical direction. Further, a pump (not shown) of the vacuum suction mechanism is controlled by the controller 110 so as to permit the wafer W to be sucked and held by the spin chuck 52. Incidentally, a reference numeral 64 denotes a cap flange made of aluminum, a reference numeral 62 denotes a guide for the vertical movement, and a reference numeral 64 denotes a cooling jacket made of a stainless steel. The cap flange 58 is mounted to cover the upper half portion of the cooling jacket 64. Also, the guide 62 for the vertical movement is mounted to the cap flange 58 so as to be parallel to the axis of the cylinder 60.

During the developing treatment, the lower end of the cap flange 58 is in contact with a unit bottom plate 50 in the vicinity of the outer periphery of the opening of the unit bottom plate 50. As a result, the inner space of the developing unit is hermetically closed. When the wafer W is delivered between the spin chuck 52 and the main arm mechanism 22, the vertical driving mechanism 60 moves upward the driving motor 54 or the spin chuck 52 so as to permit the lower end of the cap flange 58 to float from the unit bottom plate 50. As described previously, the wafer delivery port 70 is formed in the side wall of the developing unit 30. The wafer W held by the holder 48 is put into or taken out of the developing unit 30 through the wafer delivery port 70.

A developing nozzle 86 communicates with a developing solution supply unit 89 via a supply pipe 88. A gas pressure transfer system disclosed in, for example, U.S. Pat. No. 5,868,307 is used in the developing solution supply unit 89. A developing solution 90 is transferred under a pressure of 1 to 2 kgf/cm$^2$ from the developing solution supply unit 89 to the nozzle 86. The concentration and temperature of the developing solution are precisely controlled within the developing solution supply unit 89. Incidentally, a 2.38% tetramethylammonium hydroxide solution (TMAH solution) is housed as the developing solution in the supply source of the developing solution supply unit 89. Traces of a surfactant is also contained in the developing solution together with TMAH.

An arm 92 is detachably mounted to the tip portion of the developing nozzle 86. A guide rail 94 is mounted on the unit bottom plate 50 and extends in the Y-axis direction. The arm 92 is movably supported by a post 96 via the Z-axis driving mechanism 112. Further, the post 96 is movably supported by the guide rail 94 via the Y-axis driving mechanism 111. Each of the Y-axis driving mechanism 111 and the Z-axis driving mechanism 112 is controlled by the controller 110, and the developing nozzle 86 is moved in Y-axis direction and the Z-axis direction between the home position and the operating position.

A rinse nozzle 102 is detachably mounted to the tip portion of an arm 104. The arm 104 is movably supported by a post 106 via the Z-axis driving mechanism (not shown). Further, the post 106 is movably supported by the guide rail 94 via the Y-axis driving mechanism (not shown). Each of the Y-axis driving mechanism and the Z-axis driving mechanism is controlled by the controller 110, and the rinse nozzle 102 is moved in the Y-axis direction and the Z-axis direction between the home position and the operating position.

Figure 5:
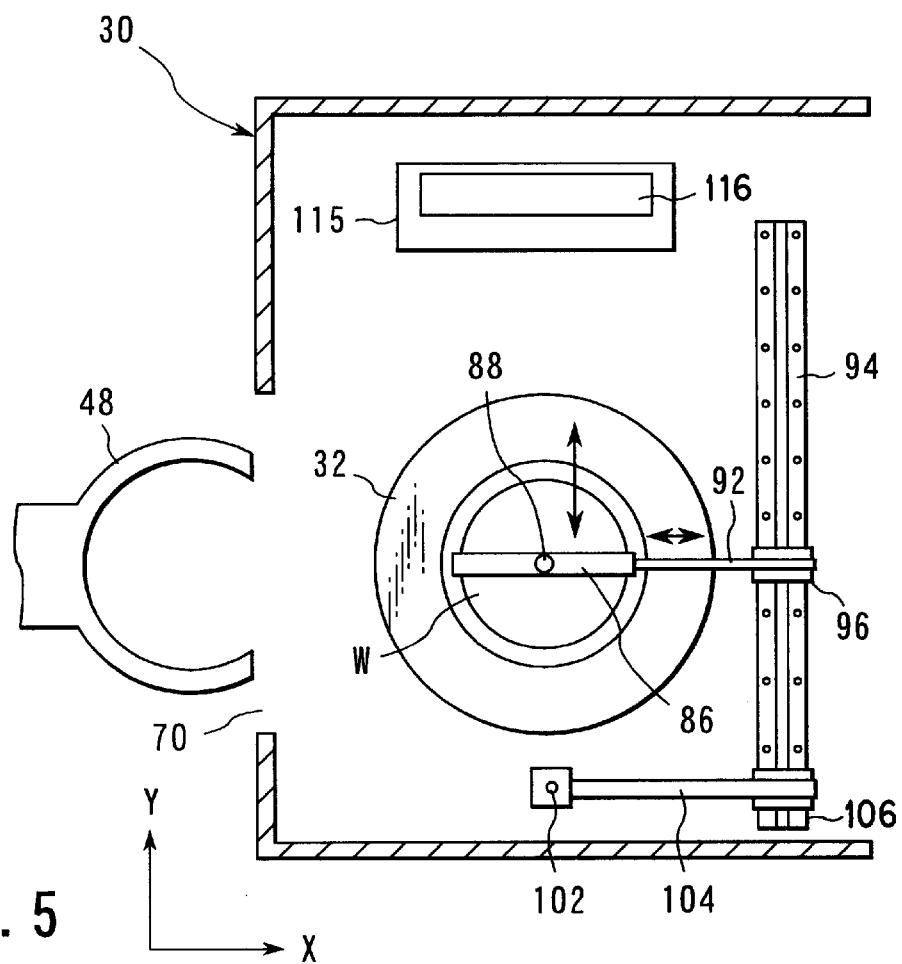
FIG. 5 is a perspective plan view showing the developing apparatus according to one embodiment of the present invention.
Figure 6:
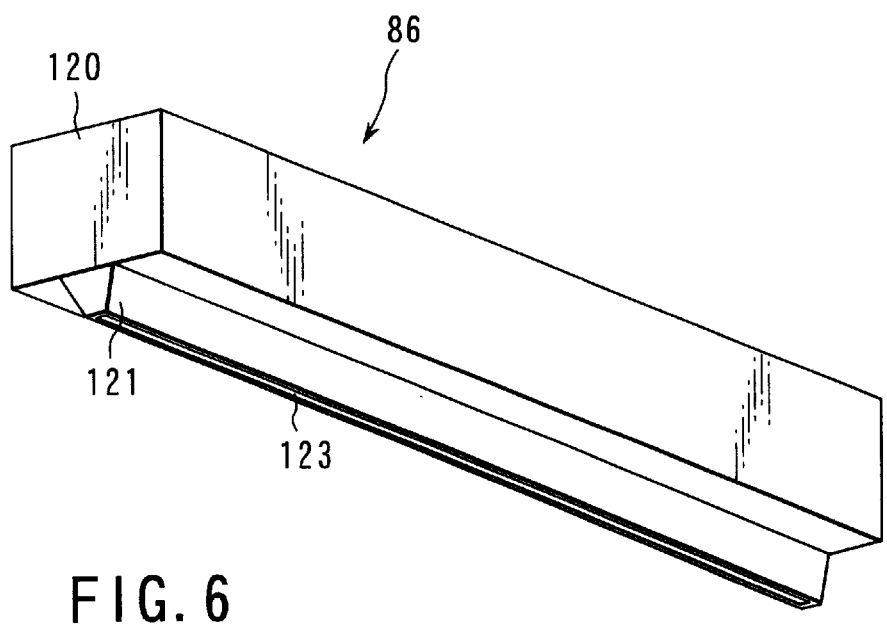
FIG. 6 is an oblique view showing a developing nozzle according to another embodiment of the present invention.

As shown in FIG. 5, a nozzle waiting section 115 is arranged in the home position of the developing nozzle 86. The developing nozzle 86 during non-operation is positioned in the waiting section 115. A washing mechanism 116 is arranged in the waiting section 115 such that a liquid discharge section 121 of the nozzle 86 is washed by the washing mechanism 116.

The developing nozzle 86 will now be described with reference to FIGS. 6, 7A, 7B, 8, 9 and 10.

A nozzle body 120 of the developing nozzle 86 is in the shape of a rectangular box. Formed within the nozzle body 120 are a liquid reservoir 122, an outlet port 124 formed at the bottom of the liquid reservoir 122, a large number of fine holes 125 positioned below and communicating with the outlet port 124, and a discharge port passageway 123 positioned below and communicating with the fine holes 125.

The upper opening of the liquid reservoir 122 is closed by a lid 129. The developing solution supply pipe 88 is mounted to an appropriate position of the lid 129. An opening 88a of the supply pipe 88 communicates with the liquid reservoir 122 such that the developing solution 90 is supplied from the developing solution supply unit 89 into the liquid reservoir 122 through the supply pipe 88. Incidentally, it is desirable to mount two or three supply pipes 88 to the lid 129, though it is possible to mount only one supply pipe 88 to the lid 129.

The length L1 of the nozzle body 120 is slightly larger than the diameter of the wafer W. A linear liquid discharge section 121 is formed in a lower portion of the nozzle body 120. A slit-like discharge port passageway 123 is open at the lowermost end of the liquid discharge section 121 such that the developing solution is discharged from the discharge port passageway 123.

The outlet port 124, which is concave, is formed in the center at the bottom of the liquid reservoir 122. Also, a large number of fine holes 125 are open at the bottom portion of the outlet port 124. These fine holes 125 are linearly arranged equidistantly along the length of the nozzle body 120. The liquid reservoir 122 communicates with the discharge port passageway 123 via the fine holes 125. The fine hole 125 (narrow passageway) functions as a resistor of the fluid circuit so as to lower the pressure (to cause pressure loss) of the developing solution 90 coming from the liquid reservoir 122, with the result that the developing solution of a low pressure is supplied to the discharge port passageway 123. Incidentally, the diameter of the discharge port passageway 123 is made larger than the diameter of the fine hole 125.

It is desirable to use a resin material having a high water repellency such as PCTFE for forming the nozzle body 120. On the other hand, it is desirable to use a material excellent in resistance to chemicals such as quartz or ceramic material for forming a buffering rod 130. Also, it is desirable for the buffering rod 130 to exhibit hydrophilic or water-absorbing properties like quartz. Further, in order to enable the buffering rod 130 to exhibit water-absorbing properties, it is possible for the buffering rod 130 itself to be made of a porous material such as a porous ceramic material. Incidentally, it is desirable for the diameter D1 of the buffering rod 130 to fall within a range of between 2.5 and 5.0 mm. Also, it is desirable for the diameter D2 of the slit-like discharge port passageway 123 to fall within a range of between 3 and 6 mm.

Figure 9:
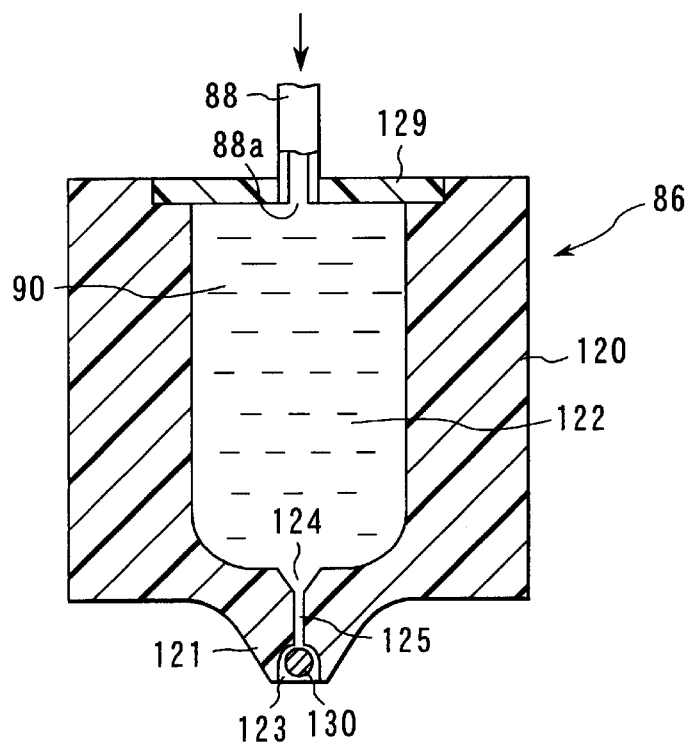
FIG. 9 is a cross sectional view showing a developing nozzle according to another embodiment of the present invention.
Figure 10:
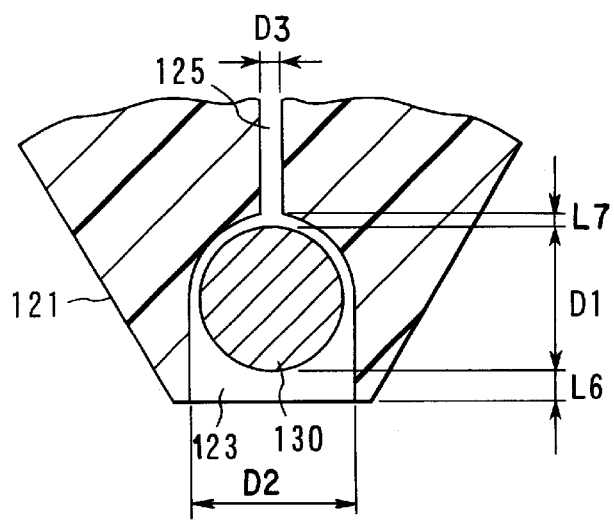
FIG. 10 is a cross sectional view showing in a magnified fashion a gist portion of the developing nozzle according to another embodiment of the present invention.

As shown in FIGS. 9 and 10, the buffering rod 130 is arranged within the discharge port passageway 123. The buffering rod 130 is arranged right under the lower opening of the fine hole 125 and is positioned slightly above the lowermost end of the liquid discharge section 121. In other words, the lower end of the buffering rod 130 is away from the lowermost end of the liquid discharge section 121 by a distance L6. Where the buffering rod 130 is retracted within the liquid discharge section 121 in this fashion, it is possible to increase the capability of holding the developing solution 90 within the liquid discharge section 121, with the result that the developing solution 90 is prevented from dropping from the discharge port passageway 123 during non-operation of the nozzle. Also, since the buffering rod 130 is not exposed to the outside through the discharge port passageway 123, foreign materials are unlikely to be attached to the buffering rod 130. Further, since the buffering rod 130 is made of a hydrophilic material such as quartz, the buffering rod 130 and the discharge port passageway 123 are allowed to exhibit a further improved function of holding the developing solution 90. What should also be noted is that the hydrophilic quartz rod 130 facilitates the transfer of the developing solution 90 from the fine hole 125 into the discharge port passageway 123, with the result that the developing solution 90 can be supplied smoothly to the discharge port passageway 123.

Figure 7A:
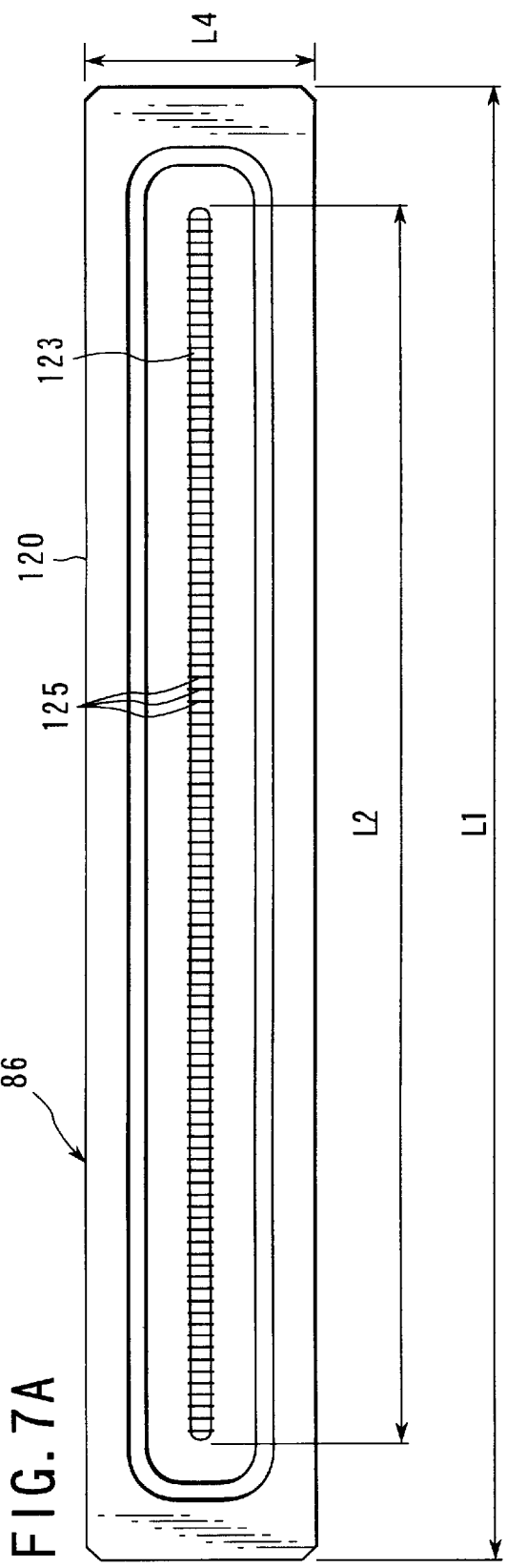
FIG. 7A is a plan view showing a developing nozzle according to another embodiment of the present invention.
Figure 7B:
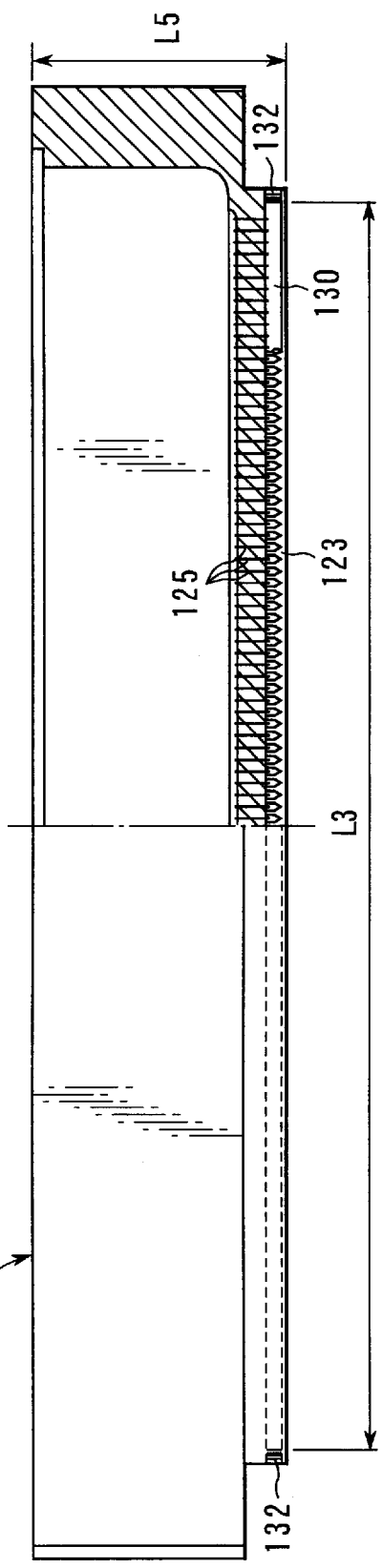
FIG. 7B is a cross sectional view showing a developing nozzle, as viewed sideways, according to another embodiment of the present invention.
Figure 8:
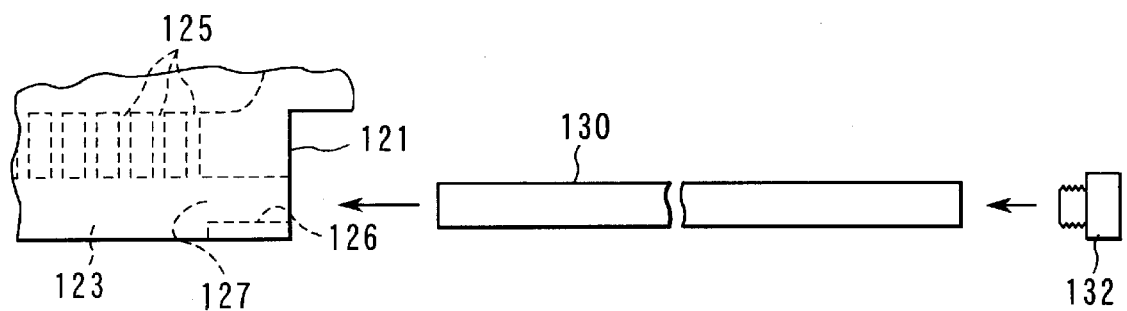
FIG. 8 shows in a dismantled fashion a part of the developing nozzle according to another embodiment of the present invention.

As shown in FIGS. 7B and 8, a hole 127 is formed on each side portion of the liquid discharge section 121, and the buffering rod 130 is inserted from the hole 127 on one side portion into the hole 127 on the other side portion. The both end portions of the buffering rod 130 are supported by supporting sections 126. The supporting section 126 is internally threaded and a cap stopper 132, which is externally threaded, is engaged with the internally threaded supporting section 126. Since the both end portions of the buffering rod 130 are fixed by the supporting section 126 and the cap stopper 132 engaged with the supporting rod 126, the buffering rod 130 do not drop down from the discharge port passageway 123.

The size of each section of the nozzle 86 for an 8-inch wafer is as follows:

Length L1 of nozzle body: 250 mm
Length L2 of discharge port: 214 mm
Length L3 of buffering rod: 221 mm
Width L4 of nozzle body: 38 mm
Height L5 of nozzle body: 36 mm
Distance L6 between buffering rod and lowermost end of discharge port: 0.5 to 2.0 mm
Distance L7 between buffering rod and lower end of fine hole: 0.2 to 1.0 mm
Distance L8 between lower end of discharge port and wafer: 0.5 to 10.0 mm
Diameter D1 of buffering rod: 3.0 mm
Diameter D2 of discharge port: 3.4 mm
Diameter D3 of fine hole: 0.4 mm
The number of fine holes: 106
Distance between adjacent fine holes: 2.0 mm A chemically amplified resist film subjected to a post-exposure baking is developed by the developing unit 30 as follows.

In the first step, the wafer W held by the holder 48 of the main arm mechanism 22 is transferred into the developing unit 30 through the wafer delivery port 70. In this step, the spin chuck 52 is moved upward by the vertical driving mechanism 60 so as to transfer the wafer W from the holder 48 onto the spin chuck 52. The wafer W is held by vacuum suction by the spin chuck 52, and the main arm mechanism 22 is operated to permit the holder 48 to be moved out of the developing unit 30. Incidentally, a downstream of a clean air is formed within the developing unit 30.

In the next step, the developing nozzle 86 is moved from the home position to the operating position to permit the liquid discharge section 121 to be positioned close to the wafer W. Under this condition, a developing solution 90 is supplied with a predetermined supply pressure from the developing solution supply unit 89 to the nozzle 86, with the result that the developing solution 90 is discharged to form a band from the nozzle 86. While the developing solution 90 is being discharged from the nozzle 86, the wafer W is rotated to make at least half the complete rotation, e.g., to make one complete rotation. Alternatively, the developing nozzle 86 is scanned along the guide rail 94. During the operation, the developing solution 90 is moved to pass successively through the liquid reservoir 122, the outlet port 124 and the fine hole 125 so as to collide against the buffering rod 130. Finally, the developing solution 90 is discharged from the discharge port passageway 123.

In this step, the developing solution 90 looses pressure when passing through the fine hole 125 and the strength of the developing solution 90 is weakened by collision against the buffering rod 130. Under this condition, the developing solution 90 passes through the clearance between the buffering rod 130 and the liquid discharge section 121, said clearance constituting a part of the discharge port passageway 123, so as to be discharged from the discharge port passageway 123. As a result, the developing solution 90 is allowed to land soft on the resist coating film so as to supply promptly the developing solution 90 onto the wafer W in an amount required for the puddle development without giving a serious influence to the light exposed latent image.

What should also be noted is that the liquid discharge section 121 is in the shape of a slit, with the result that the developing solution 90 is expanded and diffused uniformly over a wide range along the buffering rod 130. Therefore, even in the case of the conventional scanning movement system, in which the developing solution tended to fail to be supplied uniformly, the portion where the developing solution is it not supplied can be eliminated so as to carry out uniformly the developing treatment.

After completion of the developing treatment for a predetermined time, the wafer W is rotated by the spin chuck 52 so as to centrifugally remove the developing solution from the wafer W. Then, the rinse nozzle 102 is moved onto a region above the wafer W so as to wash away the developing solution remaining on the wafer W with the rinsing solution discharged from the rinsing nozzle 102. Further, the spin chuck 52 is rotated at a high speed so as to scatter the developing solution and the rinsing solution remaining on the wafer W so as to dry the wafer W, thereby finishing a series of the developing treatment.

After the developing treatment, the developing nozzle 86 is moved to the waiting position 115, and the liquid discharge section 121 of the developing nozzle 86 is washed with a nozzle washing mechanism (nozzle bath) 116.

Another embodiment of the present invention will now be described with reference to FIGS. 11 to 16.

Figure 11:
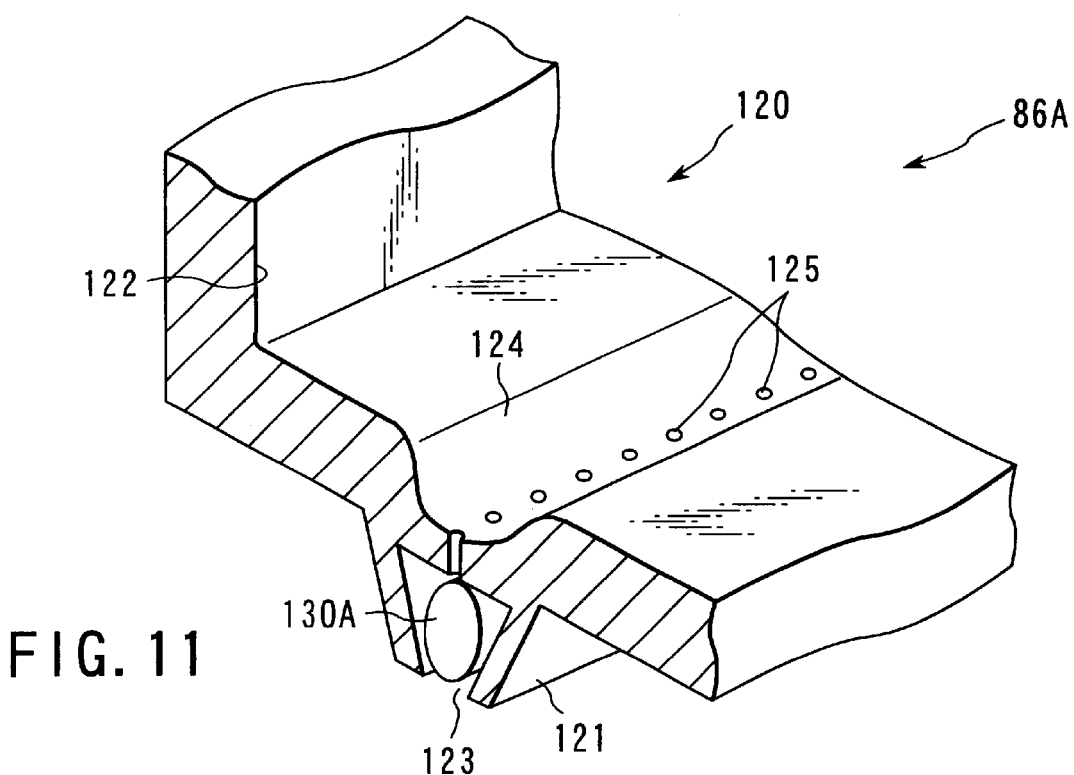
FIG. 11 is an oblique view showing a gist portion of the developing nozzle according to another embodiment of the present invention.

As shown in FIG. 11, a developing nozzle 86A comprises a colliding rod 130A having an elliptical cross section. The colliding rod 130A is supported by the liquid discharge section 121 such that the longer axis of the elliptical cross section extends in a vertical direction. The colliding rod 130A of the particular shape facilitates the flow of the developing solution 90 within the discharge port passageway 123 so as to allow the developing solution 90 to be discharged more smoothly from the discharge port passageway 123. Incidentally, the cross sectional shape of the colliding rod is not limited to an elliptical shape. For example, it is possible for the colliding rod to have a inverse triangular cross section, a diamond-shaped cross section or a heart-shaped cross section.

Figure 12:
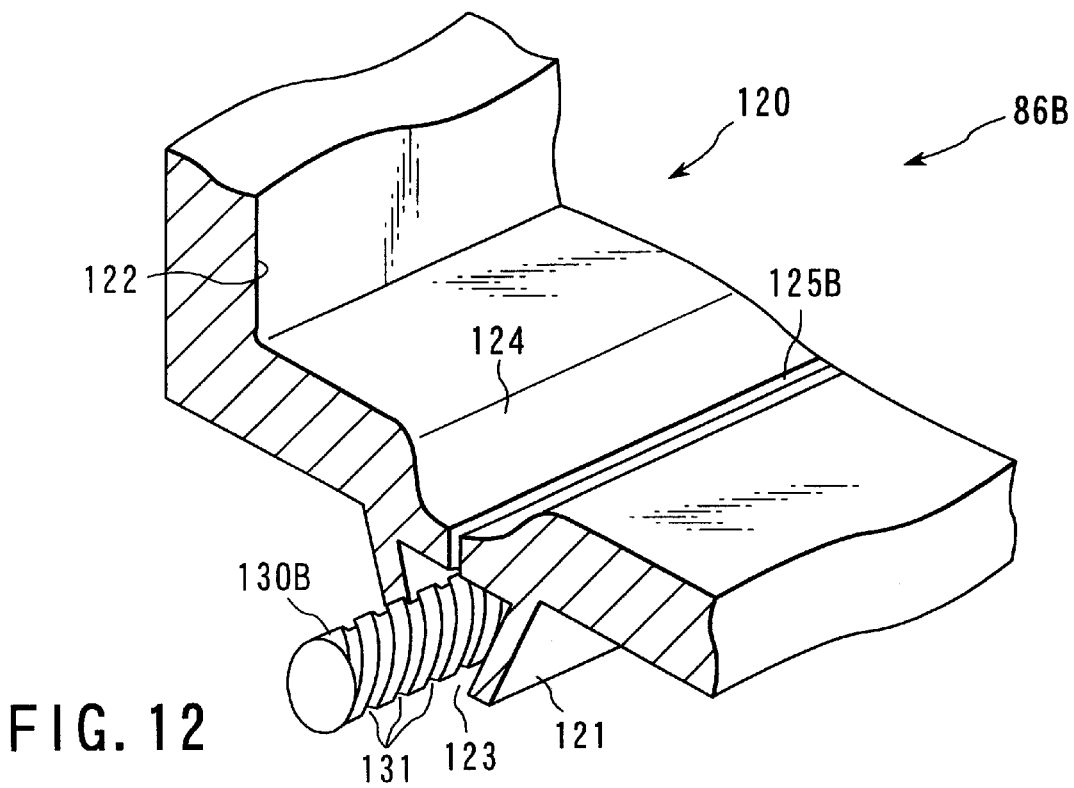
FIG. 12 is an oblique view showing a gist portion of the developing nozzle according to another embodiment of the present invention.

FIG. 12 shows that a developing nozzle 86B comprises an externally threaded colliding rod 130B. The colliding rod 130B of the particular shape is excellent in its liquid holding function and a liquid guiding function. The developing nozzle 86B also comprises a slit 125B constituting a narrow passageway. The slit 125B communicates with each of the liquid reservoir 122 and the discharge port passageway 123 and functions as a resistor of the fluid circuit so as to decrease the pressure (to cause pressure loss) of the developing solution 90 coming from the liquid reservoir 122. It is desirable for the width of the slit 125B to fall within a range of between 0.3 and 0.5 mm. Since the strength of the developing solution 90, whose pressure has been decreased by the slit 125B, is weakened by the colliding rod 130B, the developing solution discharged from the discharge port passageway 123 scarcely gives impact to the wafer W.

Figure 13:
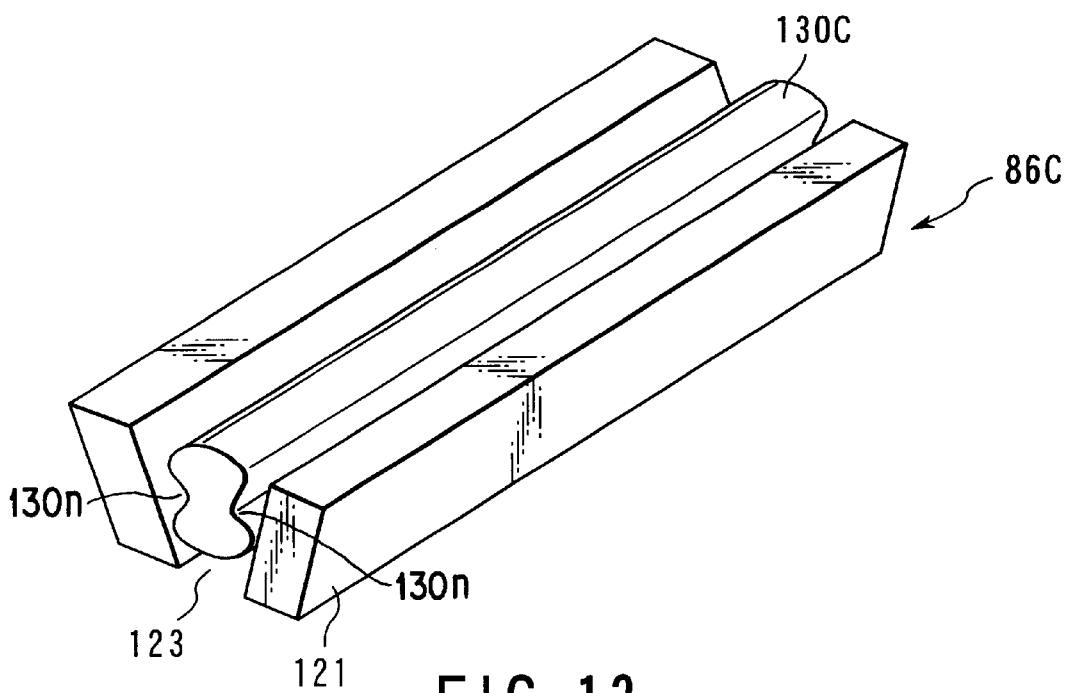
FIG. 13 is an oblique view showing a gist portion of the developing nozzle according to another embodiment of the present invention.

FIG. 13 shows that a developing nozzle 86C comprises a colliding rod 130C having a gourd-shaped cross section. The colliding rod 130C is supported by the liquid discharge section 121 such that recesses 130n are positioned on both sides of the cross section. The colliding rod 130C of the particular shape is also excellent in its liquid holding function and the liquid guiding function.

Figure 14:
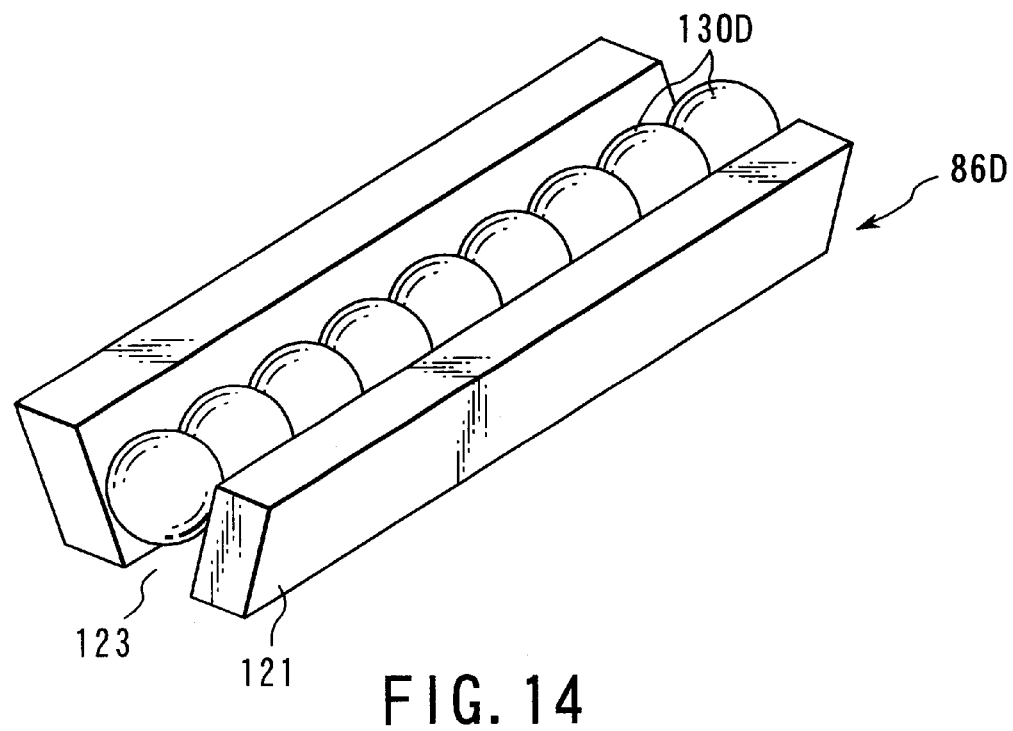
FIG. 14 is an oblique view showing a gist portion of the developing nozzle according to another embodiment of the present invention.

FIG. 14 shows a developing nozzle 86D comprising a large number of buffering balls 130D acting as buffering members. These buffering balls 130D are aligned in the liquid discharge section 121 to form a single row within the discharge port passageway 123. It is desirable for the buffering ball 130D to have a diameter of 3 to 5 mm.

Figure 15:
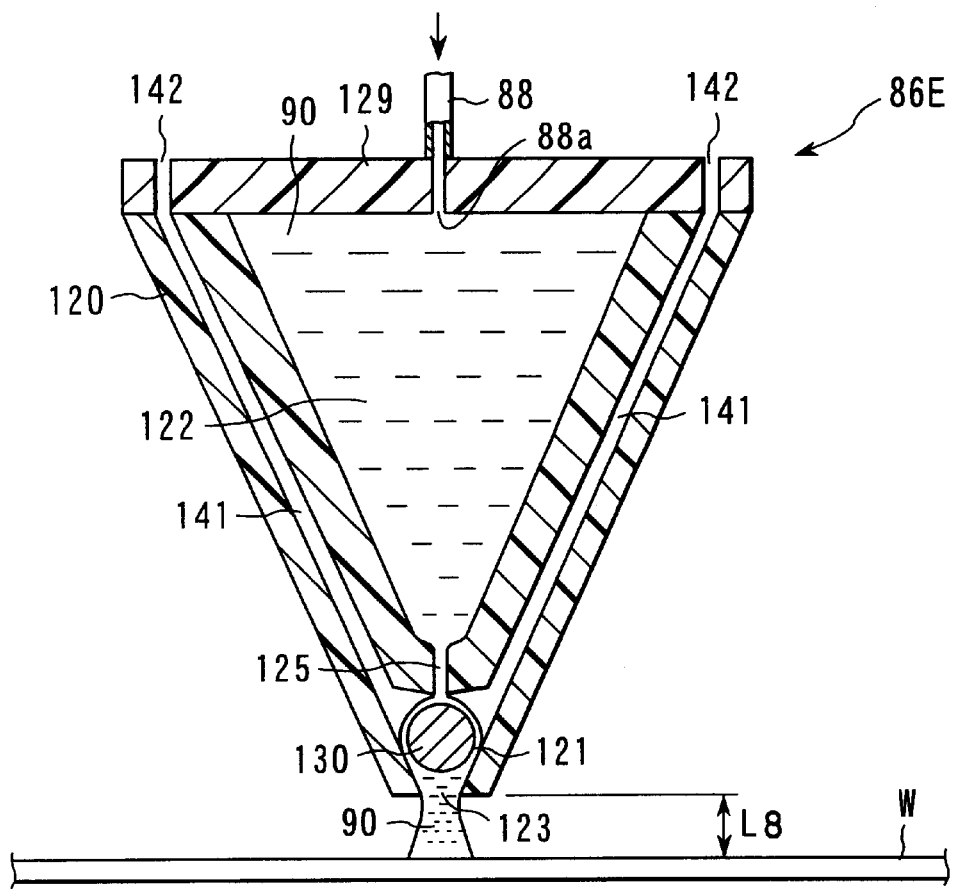
FIG. 15 is a cross sectional view showing the developing nozzle according to another embodiment of the present invention.

FIG. 15 shows a developing nozzle 86E comprising a plurality of bent passageways 141, 142. The lower end of the bent passageway 141 communicates with the discharge port passageway 123, with the upper end communicating with the bent passageway 142. The bent passageway 141 is formed within the side wall of the nozzle body 120, and the other bent passageway 142 extends through the lid 129 so as to be open on the upper end. since these bent passageways 141, 142 serve to maintain the inner pressure of the discharge port passageway 123 at the atmospheric pressure, discharge of the developing solution 90 from the discharge port passageway 123 is promoted. Incidentally, these bent passageways 141, 142 may be either fine holes or slits.

Figure 16:
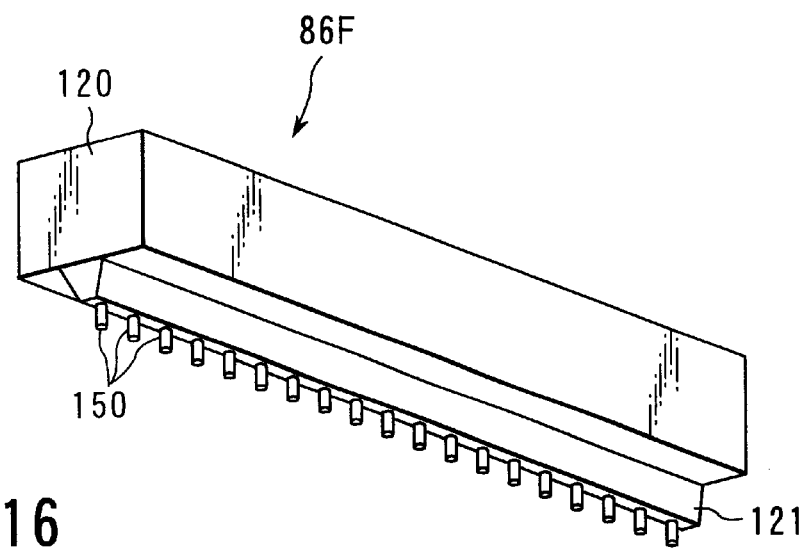
FIG. 16 is an oblique view showing the developing nozzle according to still another embodiment of the present invention.

Further, FIG. 16 shows a developing nozzle 86F, in which a plurality of fine discharge ports 150 are formed at the tip portion of the liquid discharge section 121. These fine discharge ports 150 communicate with the discharge port passageway 123. The discharge pressure of the developing solution 90 is further lowered by the fine discharge ports 150.

As described above, the discharge pressure (or discharge speed) of the developing solution is lowered by the buffering member in the present invention so as to markedly diminish the impact given by the developing solution to the substrate. It follows that it is possible to develop the resist film with a high resolution without impairing the patterned latent image.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A developing apparatus, comprising a table on which is disposed a substrate having a resist coating film formed thereon, a nozzle for supplying a developing solution to the substrate disposed on the table, a liquid supplying mechanism for supplying the developing solution to the nozzle, and a moving mechanism for relatively moving the nozzle and the substrate, wherein said nozzle includes:
    a liquid inlet port communicating with said liquid supplying mechanism;
    a liquid reservoir for temporarily storing the developing solution supplied from the liquid supplying mechanism through the liquid inlet port;
    a narrow passageway communicating with the bottom portion of the liquid reservoir to cause pressure loss of the developing solution coming from the liquid reservoir;
    a linear liquid discharge section having a discharge port passageway communicating with the narrow passageway; and
    a buffering member arranged within the discharge port passageway and in the vicinity of the outlet port of the narrow passageway, said buffering member being housed within said discharge port passageway so as not to be positioned outside said liquid discharge section, and weakening a strength of the developing solution coming out of the narrow passageway so as to weaken the impact given by the developing solution discharged from the discharge port to the resist coating film.

2. The developing apparatus according to claim 1, wherein said buffering member is positioned above the lowermost portion of said liquid discharge section.

3. The developing apparatus according to claim 1, wherein said buffering member consists of a single rod and extends from at least one end portion of said discharge port passageway to the other end.

4. The developing apparatus according to claim 3, wherein the both end portions of said single rod are supported by said liquid discharge section.

5. A The developing apparatus according to claim 3, wherein said single rod has a circular, elliptical or gourd-shaped cross section.

6. The developing apparatus according to claim 3, wherein said single rod is externally threaded.

7. The developing apparatus according to claim 1, wherein said buffering member consists of a plurality of granular bodies or lumps that are linearly arranged to extend from one end portion to the other end portion of said discharge port passageway.

8. The developing apparatus according to claim 7, wherein said plurality of granular bodies and lumps are supported by the lower portion of said liquid discharge section.

9. The developing apparatus according to claim 1, wherein said narrow passageway is open in the center at the bottom of said liquid reservoir and consists of a large number of fine holes each having a diameter smaller than the clearance of said discharge port passageway.

10. The developing apparatus according to claim 1, wherein said narrow passageway consists of a slit open in the center at the bottom of said liquid reservoir and having a width smaller than the width of said discharge port passageway.

11. The developing apparatus according to claim 1, wherein said buffering member is made of a material that is hydrophilic and exhibits resistance to alkali.

12. The developing apparatus according to claim 1, wherein said buffering member is made of quartz.

13. The developing apparatus according to claim 1, wherein said linear liquid discharge section is longer than at least the radius of the substrate.

14. A developing nozzle used in a photolithography process, comprising:
    a liquid inlet port for receiving a developing solution;
    a liquid reservoir for temporarily storing the developing solution received through the liquid inlet port;
    a narrow passageway communicating with the bottom portion of the liquid reservoir and serving to lower the pressure of the developing solution coming from the liquid reservoir;
    a linear liquid discharge section having a discharge port passageway communicating with the narrow passageway; and
    a buffering member arranged within the discharge port passageway and positioned in the vicinity of the outlet port of the narrow passageway, said buffering member being housed in said discharge port passageway so as not to be positioned outside said liquid discharge section, and serving to weaken the strength of the developing solution coming out of the narrow passageway so as to weaken the impact given by the developing solution discharged from the discharge port to the resist coating film.

15. The developing nozzle according to claim 14, wherein said buffering member is positioned above the lowermost portion of said liquid discharge section.

16. The developing nozzle according to claim 14, wherein said buffering member consists of a single rod and extends from at least one end portion of said discharge port passageway to the other end.

17. The developing nozzle according to claim 14, wherein said buffering member is made of a material that is hydrophilic and exhibits resistance to alkali.

18. The developing nozzle according to claim 14, wherein said linear liquid discharge section is longer than at least the radius of the substrate.

19. A developing apparatus, comprising a table on which is disposed a substrate having a resist coating film formed thereon, a nozzle for supplying a developing solution to the substrate disposed on the table, a liquid supplying mechanism for supplying the developing solution to the nozzle, and a moving mechanism for relatively moving the nozzle and the substrate, wherein said nozzle includes:

- a liquid inlet port communicating with said liquid supplying mechanism;
- a liquid reservoir for temporarily storing the developing solution supplied from the liquid supplying mechanism through the liquid inlet port;
- a narrow passageway communicating with the bottom portion of the liquid reservoir to cause pressure loss of the developing solution coming from the liquid reservoir;
- a linear liquid discharge section having a discharge port passageway communicating with the narrow passageway; and
- a buffering member arranged within the discharge port passageway and in the vicinity of the outlet port of the narrow passageway, said buffering member consisting of a plurality of granular bodies or lumps that are linearly arranged to extend from one end portion to the other end portion of said discharge port passageway, and weakening a strength of the developing solution coming out of the narrow passageway so as to weaken the impact given by the developing solution discharged from the discharge port to the resist coating film.

20. The developing apparatus according to claim 19, wherein said plurality of granular bodies or lumps are supported by lower portion of said discharge port passageway.

* * * * *